(12) United States Patent
Kasai

(10) Patent No.: US 8,314,646 B2
(45) Date of Patent: Nov. 20, 2012

(54) SIGNAL REPRODUCING DEVICE

(75) Inventor: Seiya Kasai, Sapporo (JP)

(73) Assignee: Japan Science and Technology Agency, Saitama (JP)

( * ) Notice: Subject to any disclaimer, the term of this patent is extended or adjusted under 35 U.S.C. 154(b) by 49 days.

(21) Appl. No.: 12/920,091

(22) PCT Filed: Sep. 2, 2008

(86) PCT No.: PCT/JP2008/065758
§ 371 (c)(1),
(2), (4) Date: Nov. 18, 2010

(87) PCT Pub. No.: WO2009/107263
PCT Pub. Date: Sep. 3, 2009

(65) Prior Publication Data
US 2011/0050332 A1    Mar. 3, 2011

(30) Foreign Application Priority Data

Feb. 29, 2008  (JP) ................ P2008-050389

(51) Int. Cl.
*G06F 7/42* (2006.01)
(52) U.S. Cl. ........................ 327/361; 327/408
(58) Field of Classification Search .......... 327/355–362, 327/403–405, 407–408
See application file for complete search history.

(56) References Cited

U.S. PATENT DOCUMENTS

| 3,699,358 A * | 10/1972 | Wilkinson | 327/405 |
| 6,696,887 B2 * | 2/2004 | Taubman | 327/560 |
| 7,394,298 B2 * | 7/2008 | Hazucha et al. | 327/108 |

FOREIGN PATENT DOCUMENTS

| JP | 2002-221546 | 8/2002 |
| JP | 2005-136758 | 5/2005 |

OTHER PUBLICATIONS

PCT Preliminary Report on Patentability for International Application No. PCT/JP2008/065758 dated Oct. 28, 2010.
Extended Abstracts (The 68 Autumn Meeting, 2007), The Japan Society of Applied Physics, Sep. 4, 2007.
Lee, et al., Nanosignal Processing: Stochastic Resonance in Carbon Nanotubes That Detect Subthreshold Signals, Nano Letters, 2003, vol. 3, No. 12, p. 1683-1686.
Lee, et al., Nano Letters Supporting Information, [online], American Chemical Society, 2003, [retrieved on Sep. 22, 2008]. Retrieved from the Internet: URL:http://pubs.acs.org/subscribed/journals/nalefd/suppinfo/nl0348239/nl0348239_s.pdf>.
International Search Report for International Patent Application No. PCT/JP2008/065758 dated Sep. 30, 2008.

* cited by examiner

Primary Examiner — An Luu
(74) Attorney, Agent, or Firm — Patterson & Sheridan LLP

(57) ABSTRACT

The purpose is to detect minute electrical signals embedded in noise with a simple device configuration and easily reduce the area of the device by utilizing a semiconductor device in particular. This signal reproducing device (1) includes: N FETs ($6_1$ to $6_N$) each receiving a common input signal ($V_{IN}$) at a gate terminal and having a bias voltage ($V_{DD}$) applied to a drain terminal; and an adder circuit (4) connected to source terminals of the FETs ($6_1$ to $6_N$), for combining currents between the drain terminals and the source terminals of the FETs ($6_1$ to $6_N$) and outputting the resulting current, wherein the FETs ($6_1$ to $6_N$) and the bias voltage ($V_{DD}$) are set so that a voltage at the gate terminal having the common input signal ($V_{IN}$) applied thereto falls within a subthreshold region of voltages less than a threshold voltage of the FETs ($6_1$ to $6_N$).

3 Claims, 6 Drawing Sheets

SIGNAL REPRODUCING DEVICE

TECHNICAL FIELD

The present invention relates to a signal reproducing device for reproducing an input signal containing noise.

BACKGROUND ART

Conventionally, for detecting minute electrical signals having noise added, a method of filtering out frequency components containing noise components, a method of averaging input signals to attenuate noise and other methods have been employed. As disclosed in patent document 1, also a method of repeating data processing such as power spectrum analysis and statistical analysis to detect minute signals embedded in noise has been devised.

CITATION LIST

Patent Literature

Patent document 1: Japanese Unexamined Patent Application Publication No. 2002-221546

SUMMARY OF INVENTION

Technical Problem

However, in the above-described type of method using a filter, it is necessary that the frequency of the minute electrical signals is previously known or the frequency is estimated and also necessary that various electronic circuits such as a filter and an amplifier are mounted in a device. In the method of performing arithmetic processing on the input signals, it is necessary to implement various functions for averaging processing and statistical analysis on a device, and its circuit configuration and functional configuration tend to be complicated.

The present invention has been made in view of the above problems, and has an object to provide a signal reproducing device that detects minute electrical signals embedded in noise with a simple device configuration and easily reduces the area of the device by utilizing a semiconductor device in particular.

Solution to Problem

To solve the above problems, a signal reproducing device according to the present invention includes: a plurality of field-effect transistors each receiving a common input signal at a gate terminal and having a bias voltage applied to a drain terminal; and an adder circuit connected to source terminals of the plurality of field-effect transistors for combining currents between the drain terminals and the source terminals of the plurality of field-effect transistors and outputting the resulting current, wherein the plurality of field-effect transistors and the bias voltage are set so that a voltage at the gate terminal having the common input signal applied thereto falls within a subthreshold region of voltages less than a threshold voltage of the plurality of field-effect transistors.

According to such a signal reproducing device, the input signal containing noise is applied to the gate terminals of the plurality of field-effect transistors each having the bias voltage applied to the drain terminal, and the drain-source currents of the plurality of field-effect transistors are combined by the adder circuit and the resulting current is output. Here, the field-effect transistors are operated in the subthreshold region, and thus it is possible to achieve a stochastic resonance phenomenon in which the detection sensitivity of the input signal is increased. Hence, it is possible to emphatically output only the input signals from among signals embedded in noise. In particular, since field-effect transistors, which are semiconductor devices, are used, it is possible to easily reduce the area and size of a device.

Advantageous Effects of Invention

According to the present invention, it is possible to detect minute electrical signals embedded in noise with a simple device configuration and easily reduce the area of the device by utilizing a semiconductor device in particular.

Figure 1:
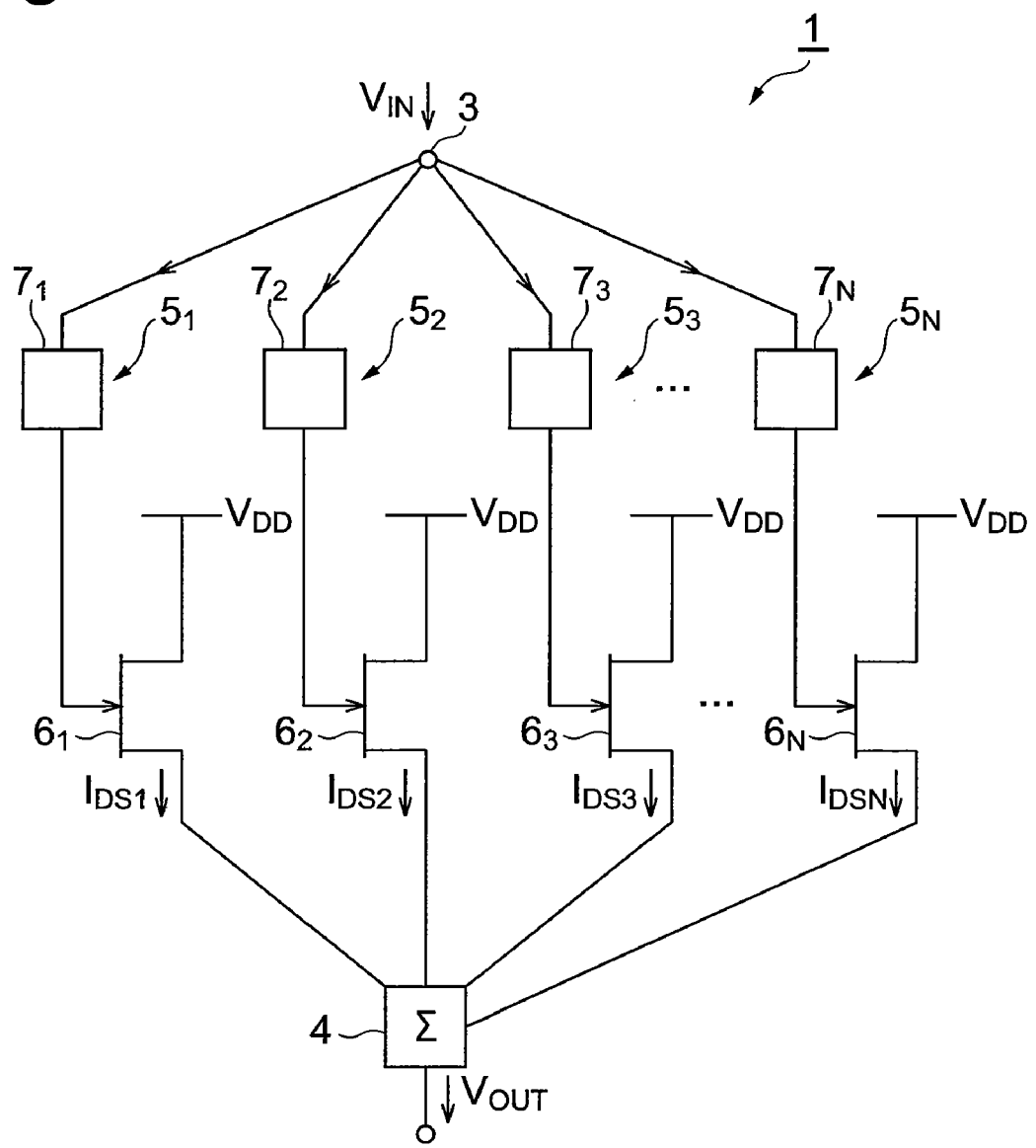
FIG. 1 is a circuit diagram of a signal reproducing device according to a preferred embodiment of the present invention.

REFERENCE SIGNS LIST 1 and 101: signal reproducing device, 4: adder circuit, $6_1$ to $6_N$: FETs (field-effect transistor), 8: offset adder circuit (voltage source circuit), $7_1$ to $7_N$: noise sources, $I_{DS1}$ to $I_{DSN}$: drain-source currents, $V_{DD}$: bias voltage, $V_G$: gate-source voltage, $V_{IN}$: input signal, $V_{OUT}$: output signal

DESCRIPTION OF EMBODIMENTS

A preferred embodiment of a signal reproducing device according to the present invention will be described below in detail with reference to the accompanying drawings. In the drawings, like and corresponding parts are identified with like symbols, and their description will not be repeated.

FIG. 1 is a circuit diagram of a signal reproducing device 1 according to a preferred embodiment of the present invention. The signal reproducing device 1 reproduces and extracts minute signals from among minute signals that are analogue signals such as image signals and sound signals embedded in noise, and has a configuration in which N (N is an integer of two or more) current source circuits $5_1$ to $5_N$ are connected in parallel between an input terminal 3 having an input signal $V_{IN}$ input and an adder circuit 4 for extracting an output signal $V_{OUT}$. The input signal $V_{IN}$ is an analogue signal such as a pulse signal of a given frequency; noise such as thermal noise having random level and frequency is previously added to the input signal $V_{IN}$.

The current source circuits $5_1$ to $5_N$ are formed with field-effect transistors (hereinafter, referred to as FETs) $6_1$ to $6_N$ and noise sources $7_1$ to $7_N$, respectively. Bias voltages $V_{DD}$ are applied to the drain terminals of the FETs $6_1$ to $6_N$, respectively, and their source terminals are connected to the input of the adder circuit 4. The gate terminals of the FETs $6_1$ to $6_N$ are connected to the input terminal 3 through noise sources $7_1$ to $7_N$, respectively. Since the connection configuration described above is employed, with the bias voltages $V_{DD}$ applied to the drain terminals, the FETs $6_1$ to $6_N$ receive the common input signal $V_{IN}$ at the gate terminals, respectively, and thus generate drain-source currents $I_{DS1}$ to $I_{DSN}$, and input the currents $I_{DS1}$ to $I_{DSN}$ to the adder circuit 4.

As the FETs $6_1$ to $6_N$, for example, a semiconductor device is used in which semiconductor channels having a modulation-doped heterojunction and a width of a few hundred nm are linearly formed on a GaAs substrate, and Schottky gates having a gate length of 600 nm are formed on the semiconductor channels. As this semiconductor channel, an AlGaAs/GaAs modulation-doped heterojunction in which a GaAs layer and an AlGaAs layer are deposited in this order can be employed. The configuration of the FETs $6_1$ to $6_N$ is not limited to the configuration described above; it is possible to employ any other configuration such as JFETs or MOSFETs.

The noise sources $7_1$ to $7_N$ are resistive elements for intentionally adding noise to the input signal $V_{IN}$ input from the input terminal 3. The use of such resistive elements as the noise sources allows thermal noise having no correlation between a plurality of noise sources $7_1$ to $7_N$ to be added to the input signal V. The change of the resistance value of the resistive elements constituting the noise sources $7_1$ to $7_N$ allows the adjustment of the average level of the noise added to the input signal $V_{IN}$, as appropriate.

Figure 2:
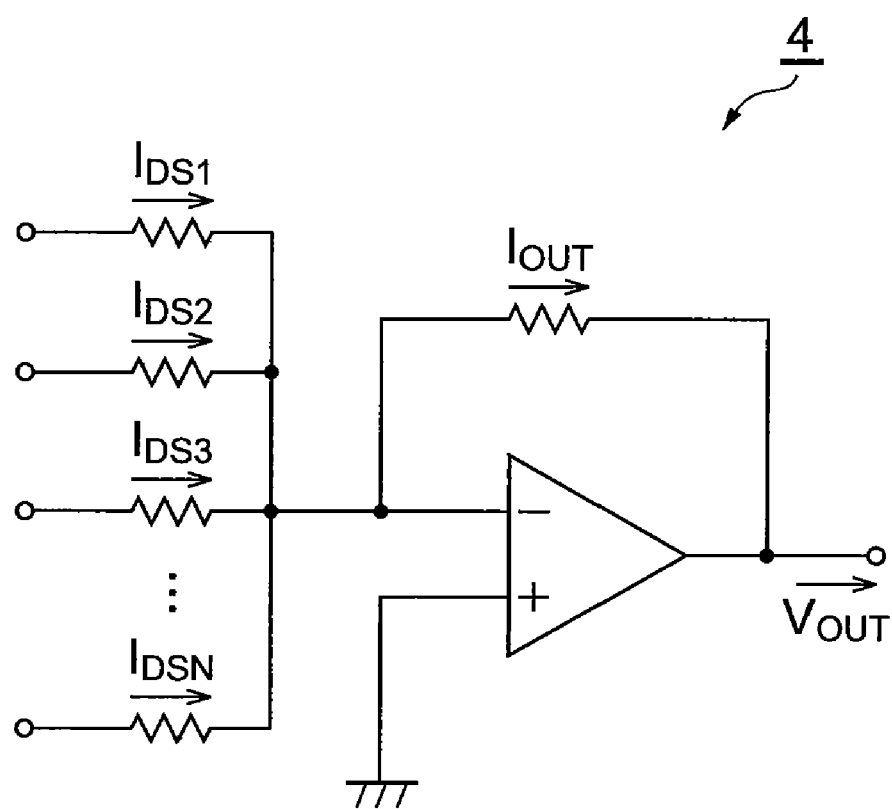
FIG. 2 is a circuit diagram showing an example of the configuration of an adder circuit of FIG. 1.

The adder circuit 4 is a circuit that combines the drain-source currents $I_{DS1}$ to $I_{DSN}$ of the FETs $6_1$ to $6_N$ and outputs the output signal $V_{OUT}$ corresponding to the resultant current $I_{OUT}$. FIG. 2 is a circuit diagram showing an example of the configuration of the adder circuit 4. As shown in the figure, in the adder circuit 4, the drain-source currents $I_{DS1}$ to $I_{DSN}$ are input through the resistive elements to the inverting input of an operational amplifier, a feedback resistor is connected between the inverting input and the output of the operational amplifier and its non-inverting input is grounded. The output voltage of the operational amplifier is output as the output signal $V_{OUT}$, and thus the output signal $V_{OUT}$ corresponding to the resultant current $I_{OUT}$ obtained by adding together the drain-source currents $I_{DS1}$ to $I_{DSN}$ is extracted.

Figure 3:
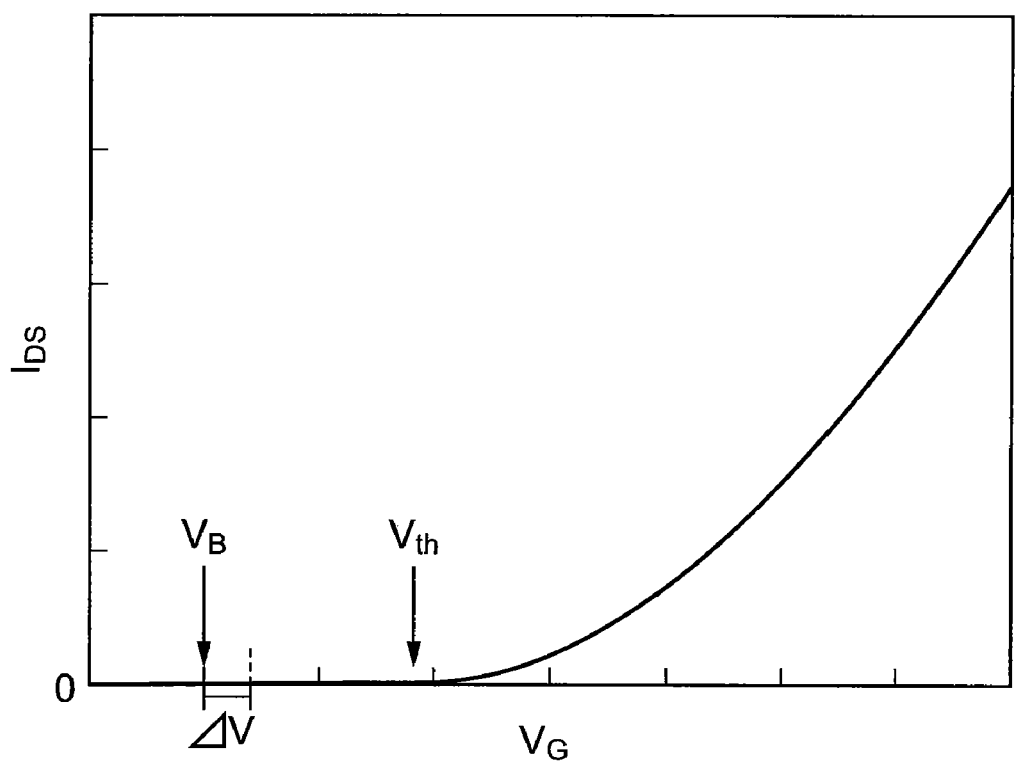
FIG. 3 is a graph showing the relationship between a gate-source voltage and a drain-source current of an FET of FIG. 1.

The signal reproducing device 1 configured as above is set so as to satisfy a predetermined condition between the signal level of the input signal $V_{IN}$ and the characteristic of the FETs $6_1$ to $6_N$. FIG. 3 is a graph showing the relationship between a gate-source voltage $V_G$ and a drain-source current $I_{DS}$ of the FETs $6_1$ to $6_N$ when the predetermined bias voltages $V_{DD}$ are applied. The FETs $6_1$ to $6_N$ are designed to have the same electrical characteristic. The FETs $6_1$ to $6_N$ are so-called normally-off type devices, and have a positive value as a threshold voltage $V_{th}$ for achieving conduction between the drain and source. On the other hand, the relationship between an offset voltage $V_B$ and the bias voltage $V_{DD}$ is set so that the voltage value of the input signal $V_{IN}$ whose offset voltage is $V_B$ and amplitude voltage is $\Delta V$ is less than the threshold voltage $V_{th}$, that is, the input signal $V_{IN}$ is applied to the gate terminal in the subthreshold region of the FETs $6_1$ to $6_N$. In this way, it is possible to operate the FETs $6_1$ to $6_N$ in the subthreshold region when the input signal $V_{IN}$ is applied to the gate terminals of the FETs $6_1$ to $6_N$.

The design parameters of the FETs $6_1$ to $6_N$ themselves may be set so that the voltage value of the input signal $V_{IN}$ falls within the subthreshold region of the FETs $6_1$ to $6_N$. For example, the gate length and the channel width of the FETs $6_1$ to $6_N$ are considered to be set.

With the signal reproducing device 1 described above, the input signal $V_{IN}$ containing noise is applied to the gate terminals of the N FETs $6_1$ to $6_N$ having the bias voltage $V_{DD}$ applied to the drain terminals, and the drain-source currents $I_{DS1}$ to $I_{DSN}$ of the FETs $6_1$ to $6_N$ are combined by the adder circuit 4 and are output as the output signal $V_{OUT}$. Here, it is possible to effectively achieve a stochastic resonance phenomenon in which the FETs $6_1$ to $6_N$ are operated in the subthreshold region and their output currents are combined, and thus the detection sensitivity of the input signal $V_{IN}$ is increased. Consequently, it is possible to emphatically output only the input signals from among signals embedded in noise. In particular, since FETs and operational amplifiers, which are semiconductor devices, are used as main elements, it is possible to easily reduce the area and size of a device.

Figure 4:
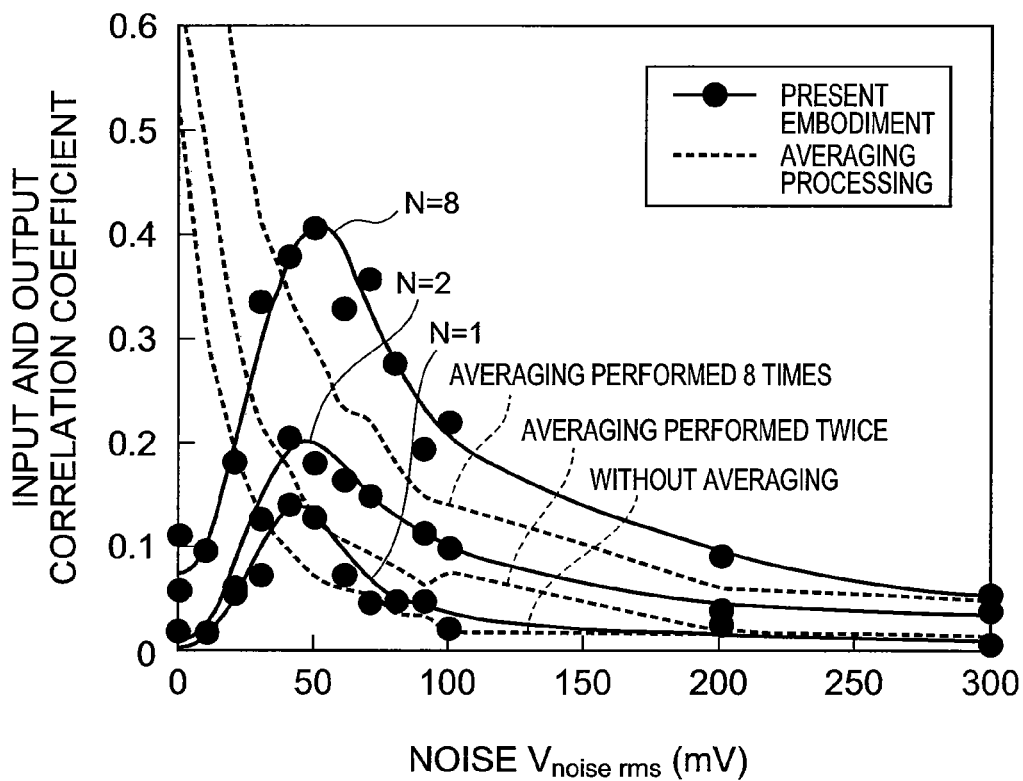
FIG. 4 is a graph showing the relationship between a standard deviation of noise contained in an input signal and an input and output correlation coefficient in the signal reproducing device of FIG. 1.

FIG. 4 is a graph showing the results of an experiment on the relationship between the standard deviation of the noise contained in the input signal $V_{IN}$ and an input and output correlation coefficient in the signal reproducing device 1. Here, an ambient temperature was set at 293 K, the frequency of the input signal $V_{IN}$ was set at 100 Hz, a duty ratio was set at 20 percent, a peak-to-peak voltage was set at 20 mV and the drain-source voltage of the FETs $6_1$ to $6_N$ was set at 0.1 V. The input and output correlation coefficient was determined by calculating the correlation coefficient between the input signal $V_{IN}$ and the output current $I_{OUT}$. In the figure, the result obtained by reproducing the input signal $V_{IN}$ through conventional averaging processing is also shown. The results show that, in the signal reproducing device 1, the input and output correlation coefficient is maximum around 50 mV of the standard deviation $V_{noiserms}$ of the noise, and that, when the noise intensity is appropriate therearound, the input and output correlation coefficient and the S/N ratio are increased. The results also show that, as the number N of FETs $6_1$ to $6_N$ connected in parallel is increased from 1 to 2, 8, . . . , the maximum value of the input and output correlation coefficient is increased, and that the input and output correlation coefficient is raised in the wide range of the standard deviation $V_{noiserms}$ of the noise. By contrast, when the averaging processing is performed on the input signal $V_{IN}$ and the number of times that the averaging processing is performed is increased, the input and output correlation coefficient is raised but the raising effect is low as compared with the signal reproducing device 1. Moreover, as the standard deviation $V_{noiserms}$ of the noise increases, the input and output correlation coefficient decreases monotonously. Hence, it has been found that, when the waveform of the input signal $V_{IN}$ containing noise is reproduced, the signal reproducing device 1 is advantageous in terms of signal reproduction effects and the processing time.

Since the noise sources $7_1$ to $7_N$ are further provided, the adjustment of the level of the noise contained in the input signal $V_{IN}$ allows the input and output correlation coefficient, that is, the S/N ratio to be easily optimized and the sensitivity of detection of the input signal to be increased.

Figure 5:
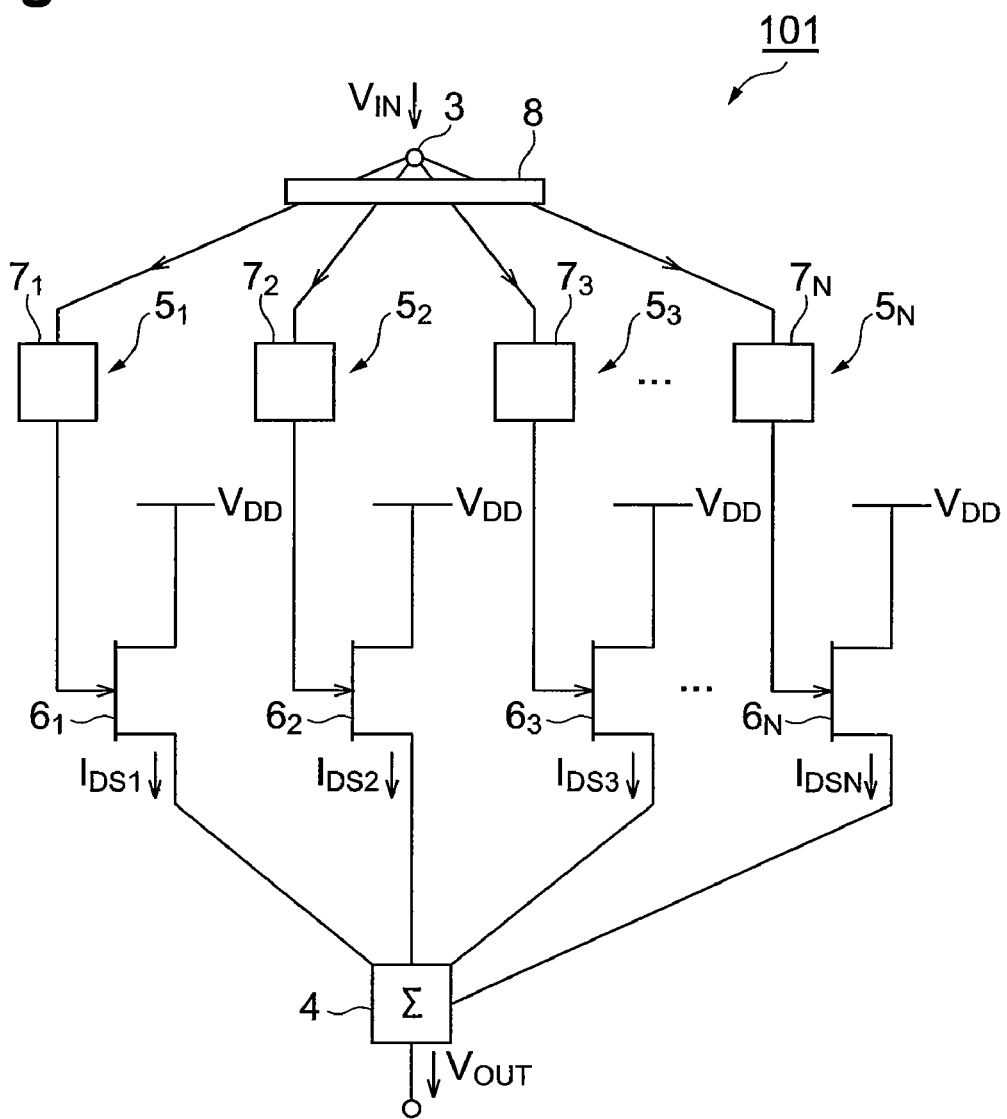
FIG. 5 is a circuit diagram of a signal reproducing device of a variation of the present invention.

The present invention is not limited to the embodiment described above. For example, as with a signal reproducing device 101 shown in FIG. 5, which is a variation of the present invention, an offset addition circuit (voltage source circuit) 8 is provided between the input terminal 3 and the gate terminals of the FETs $6_1$ to $6_N$, an offset voltage is added by the offset addition circuit 8 and thus the gate-source voltage $V_G$ of the FETs $6_1$ to $6_N$ may fall within the subthreshold region. In this way, since it is possible to adjust the gate-source voltage so that the FETs $6_1$ to $6_N$ may be operated in the subthreshold region, signal detection suitable for input signals $V_{IN}$ of various levels is achieved.

Figure 6:
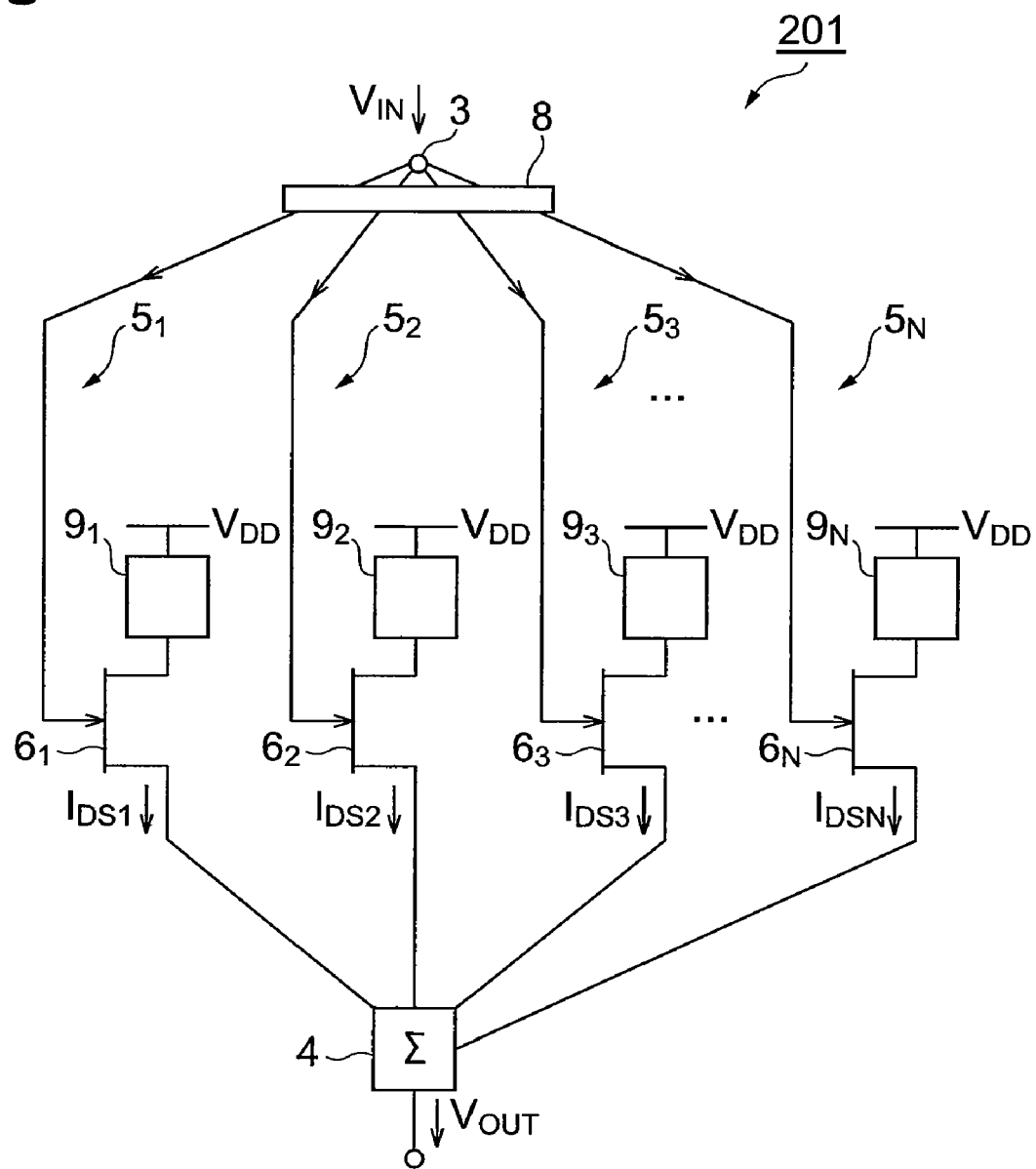
FIG. 6 is a circuit diagram of a signal reproducing device of a variation of the present invention.

Furthermore, as with a signal reproducing device 201 shown in FIG. 6, which is a variation of the present invention, noise sources $9_1$ to $9_N$ are connected to the drain terminals of the FETs $6_1$ to $6_N$, respectively, and thus noise may be superimposed on the bias voltages $V_{DD}$ applied to the drain terminals. Alternatively, the noise sources $9_1$ to $9_N$ may be connected to the source terminals of the FETs $6_1$ to $6_N$, respectively. In this way, the noise having no correlation with a relative potential between the gate and drain or between the gate and source of the FETs $6_1$ to $6_N$ is added, and the resistance value of resistive elements constituting the noise sources $9_1$ to $9_N$ is changed, which allows the input and output correlation coefficient, that is, the S/N ratio to be easily optimized and the sensitivity of detection of the input signal to be increased.

It is not necessary to perform setting so that all the FETs $6_1$ to $6_N$ are operated in the subthreshold region; the FETs $6_1$ to $6_N$ or the bias voltages $V_{DD}$ may be set so that some of the FETs $6_1$ to $6_N$ are operated in the subthreshold region.

As the noise sources $7_1$ to $7_N$ and $9_1$ to $9_N$, PN junction diodes, FETs or flip-flop circuits can be used to add element noise and M-sequence noise generated by an LFSR (linear feedback shift register) circuit as the noise.

Preferably, a noise source connected to the gate terminal for adding noise to the input signal is further provided. In this case, the adjustment of the level of the noise contained in the input signal allows the sensitivity of detection of the input signal to be easily optimized.

Preferably, a noise source connected to at least one of the drain terminal and the source terminal for adding noise to the bias voltage is further provided. In this case also, the noise is added to a voltage of the gate terminal relative to the drain terminal or the source terminal of the field-effect transistor, which allows the sensitivity of detection of the input signal to be easily optimized.

Preferably, a voltage source circuit for adding an offset to the input signal such that the voltage of the gate terminal falls within the subthreshold region is further provided. The provision of the voltage source circuit allows the gate voltage to be adjusted so that the field-effect transistor is operated in the subthreshold region, thereby achieving signal detection suitable for various levels of input voltage.

INDUSTRIAL APPLICABILITY

The present invention is applied to a signal reproducing device for reproducing and extracting minute signals; it is possible to detect minute electrical signals embedded in noise with a simple device configuration and to easily reduce the area of the device by utilizing a semiconductor device in particular.

The invention claimed is:

1. A signal reproducing device comprising:
   a plurality of semiconductor field-effect transistors each receiving a common input signal at a gate terminal and having a bias voltage applied to a drain terminal;
   an adder circuit connected to source terminals of the plurality of semiconductor field-effect transistors for adding currents between the drain terminals and the source terminals of the plurality of semiconductor field-effect transistors and outputting the resulting current; and
   a noise source connected to at least one of the drain terminal and the source terminal for adding noise to the bias voltage,
   wherein the plurality of semiconductor field-effect transistors and the bias voltage are set so that a voltage at the gate terminal having the common input signal applied thereto falls within a subthreshold region of voltages less than a threshold voltage of the plurality of semiconductor field-effect transistors.

2. The signal reproducing device of claim 1 further comprising:
   a noise source connected to the gate terminal for adding noise to the input signal.

3. The signal reproducing device of claim 1 further comprising:
   a voltage source circuit that adds an offset to the input signal so that the voltage at the gate terminal falls within the subthreshold region.

* * * * *